(12) United States Patent
Signoff et al.

(10) Patent No.: US 9,106,186 B1
(45) Date of Patent: Aug. 11, 2015

(54) REDUCED GAIN VARIATION BIASING FOR SHORT CHANNEL DEVICES

(71) Applicant: Marvell International Ltd., Hamilton (BM)

(72) Inventors: David M. Signoff, Santa Clara, CA (US); Wayne A. Loeb, Belmont, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/268,108

(22) Filed: May 2, 2014

Related U.S. Application Data

(63) Continuation of application No. 14/037,924, filed on Sep. 26, 2013, now Pat. No. 8,729,958, which is a continuation of application No. 13/739,080, filed on Jan. 11, 2013, now Pat. No. 8,669,807, which is a continuation of application No. 13/462,968, filed on May 3, 2012, now Pat. No. 8,362,826, which is a continuation of application No. 13/193,998, filed on Jul. 29, 2011, now Pat. No. 8,174,307, which is a continuation of application No. 12/606,746, filed on Oct. 27, 2009, now Pat. No. 7,994,847.

(60) Provisional application No. 61/149,444, filed on Feb. 3, 2009, provisional application No. 61/112,003, filed on Nov. 6, 2008.

(51) Int. Cl.
*G05F 1/10* (2006.01)
*H03F 1/30* (2006.01)

(52) U.S. Cl.
CPC .................................. *H03F 1/30* (2013.01)

(58) Field of Classification Search
CPC ............ G05F 3/02; G05F 3/26; G05F 3/262; H03F 1/30; H03F 1/56; H03F 2200/474
See application file for complete search history.

(56) References Cited

U.S. PATENT DOCUMENTS

| | | | | |
|---|---|---|---|---|
| 6,127,890 A * | 10/2000 | Shimomura et al. | ........... | 330/254 |
| 6,737,909 B2 | 5/2004 | Jaussi et al. | | |
| 6,930,549 B2 * | 8/2005 | Kajiwara et al. | ............... | 330/254 |
| 7,046,077 B2 | 5/2006 | Ozasa et al. | | |
| 7,486,129 B2 | 2/2009 | Pietri et al. | | |
| 7,728,654 B2 | 6/2010 | Hsieh et al. | | |
| 8,102,200 B2 | 1/2012 | Araki | | |

* cited by examiner

*Primary Examiner* — Jeffrey Zweizig

(57) ABSTRACT

An amplifier biasing circuit that reduces gain variation in short channel amplifiers, an amplifier biasing circuit that produces a constant Gm biasing signal for short channel amplifiers, and a multistage amplifier that advantageously incorporates embodiment of both types of amplifier biasing circuits are described. Both amplifier biasing circuit approaches use an operational amplifier to equalize internal bias circuit voltages. The constant Gm biasing circuit produces a Gm of 1/R, where R is the value of a trim variable resistor value. The biasing circuit that reduces gain variation produces a Gm of approximately 1/R, where R is the value of a trim variable resistor value, however, the biasing circuit is configurable to adjust the bias circuit Gm to mitigate the impact of a wide range of circuit specific characteristics and a wide range of changes in the operational environment in which the circuit can be used, such as changes in temperature.

20 Claims, 13 Drawing Sheets

REDUCED GAIN VARIATION BIASING FOR SHORT CHANNEL DEVICES

INCORPORATION BY REFERENCE

This application is a continuation of U.S. application Ser. No. 14/037,924, filed on Sep. 26, 2013, which is a continuation of U.S. application Ser. No. 13/739,080, filed on Jan. 11, 2013, now issued as U.S. Pat. No. 8,669,807, which is a continuation of U.S. application Ser. No. 13/462,968, filed on May 3, 2012, now issued as U.S. Pat. No. 8,362,826, which is a continuation of U.S. application Ser. No. 13/193,998, filed on Jul. 29, 2011, now issued as U.S. Pat. No. 8,174,307, which is a continuation of U.S. application Ser. No. 12/606,746, filed on Oct. 27, 2009, now issued as U.S. Pat. No. 7,994,847, which claims priority under 35 U.S.C. §119(e) to U.S. Provisional Application No. 61/149,444, filed on Feb. 3, 2009, and U.S. Provisional Application No. 61/112,003, filed on Nov. 6, 2008. The disclosures of the applications referenced above are incorporated herein by reference in their entireties.

BACKGROUND

The physical dimensions of transistors used to construct an integrated circuit determine the maximum frequency at which the integrated circuit can be operated. In general, the smaller the feature dimensions of a transistor, e.g., the gate dimensions, the higher the maximum frequency at which the transistor can be operated. For example, an example embodiment of a high frequency transistor, or short channel transistor, that is suitable for use in the Gm stage of a 5.5 GHz amplifier may have a channel length of approximately 60 nanometers (nm).

The gain response produced by a high frequency amplification circuit design that uses short channel transistors can vary when the same amplifier circuit design is implemented using different transistor technologies, i.e., process changes. Further, the gain response produced by a high frequency amplification circuit design that uses short channel transistors can vary in response to changes in the operating environment, e.g., the operating temperature, of the amplification circuit. In addition, the gain response produced by a high frequency amplification circuit that uses short channel transistors can be adversely affected by small manufacturing variances in the physical dimensions, e.g., physical gate dimensions, of transistors used in the circuit.

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

SUMMARY

A short channel amplifier biasing circuit that reduces gain variation in high frequency amplification circuits, a short channel amplifier biasing circuit that produces a constant Gm biasing signal for high frequency amplification circuits, and a multistage amplifier that advantageously incorporates embodiments of both types of short channel amplifier biasing circuits are described. Both amplifier biasing circuit approaches use an operational amplifier to equalize internal bias circuit voltages. The constant Gm biasing circuit produces a Gm of 1/R, where R is the resistance value assigned to a circuit trim resistor. The biasing circuit that reduces gain variation produces a Gm of approximately 1/R, where R is the resistance value assigned to a circuit trim resistor, however, the biasing circuit is configurable to adjust the bias circuit's Gm to mitigate the impact circuit-specific variations and to mitigate the impact of variations in the operational environment in which the circuit can be used, such as variations in operating temperature.

Bias circuits using current mirror configurations that operate well using low frequency, long channel transistors, do not perform well when using high frequency, short channel transistors. One reason for this poor performance is that the drain-to-source voltage, Vds, of the driving transistor device in the biasing circuit is different from the drain-to-source voltage, Vds, of the transistor device receiving a biasing signal generated by the biasing circuit. The described biasing circuits overcome this problem by using an operational amplifier to equalize the respective drain-to-source voltages, thereby allowing the current mirror biasing circuits to perform well using high frequency, short channel transistors.

The described biasing circuits may be used in a wide range of applications, including semiconductor integrated circuit systems on a chip that include control interfaces to external devices. For example, the described biasing devices may be used by the pre-power amplifier in a controller for an external power amplifier used to power a radio frequency antenna, or may be used in a low noise amplifier used to amplify a signal received via a radio frequency receiver. However, the described biasing circuits may be used in any circuit that requires biasing circuits that can be adapted to mitigate the varied effects of process change and operating conditions on an amplifier circuit.

In one example embodiment, a bias signal circuit is described that includes, a first current branch that includes, a first cascode transistor, and a constant current source connected in series with the first cascode transistor, a second current branch that includes, a second cascode transistor with a channel width-to-length ratio that is approximately 4 times a channel width-to-length ratio of the first cascode transistor, the gate of the first cascode transistor and second cascode transistor connected to a common node, a short channel mirror device transistor connected in series with the second cascode transistor, and a trim resistor connected in series between the second cascode transistor and the short channel mirror device transistor, and an operational amplifier, a first input node of the operational amplifier connected between the trim resistor and the short channel mirror device transistor at a drain terminal of the short channel mirror device transistor, a second input node of the operational amplifier connected between the first cascode transistor and the constant current source, and an output node connected to a gate terminal of the short channel mirror device transistor.

In a second example embodiment, a bias signal circuit is described that includes, a first current branch that includes a first cascode transistor, and a first short channel transistor connected in series with the first cascode transistor, a second current branch that includes a second cascode transistor, a gate of the first cascode transistor and a gate of the second cascode transistor connected to a common node, a second short channel transistor, with a channel width-to-length ratio that is approximately 4 times the channel width-to-length ratio of the first short channel transistor, connected in series with the second cascode transistor, and a trim resistor connected in series with the second cascode transistor and the second short channel transistor between a source terminal of the second short channel transistor and a LOW source voltage, and an operational amplifier, a first input node of the operational amplifier connected between the first cascode transistor and a drain terminal of the first short channel transistor, a second input node of the operational amplifier connected between the second cascode transistor and a drain terminal of the second short channel transistor, and an output node of the operational amplified connected to a gate terminal of the first short channel transistor and a gate terminal of the second short channel transistor.

In a third example embodiment, a multistage amplifier is described that includes a first amplifier stage that receives a bias signal generate by the bias circuit of the first example embodiment described above, and a second amplifier stage that receives a bias signal generate by the bias circuit the second example embodiment described above, in which an input signal provided to the second amplifier stage amplifies is an output signal generated by the first amplifier circuit.

In a fourth example embodiment, a method of controlling a variable current source is described that includes, monitoring a magnitude of a first monitored current passing through a mirror transistor device of an amplifier biasing circuit, and adjusting a magnitude of a first drawn current drawn away from the mirror transistor device through the variable current source based on the magnitude of the first monitored current and a first monitored current first setting.

BRIEF DESCRIPTION OF THE DRAWINGS

Examples of an amplifier biasing circuit that reduces gain variation in short channel amplifiers, examples of an amplifier biasing circuit that produces a constant Gm biasing signal for short channel amplifiers, and examples of a multistage amplifier that uses example embodiments of both types of biasing circuits, will be described with reference to the following drawings, wherein like numerals designate like elements.

DETAILED DESCRIPTION OF EMBODIMENTS

Figure 1:
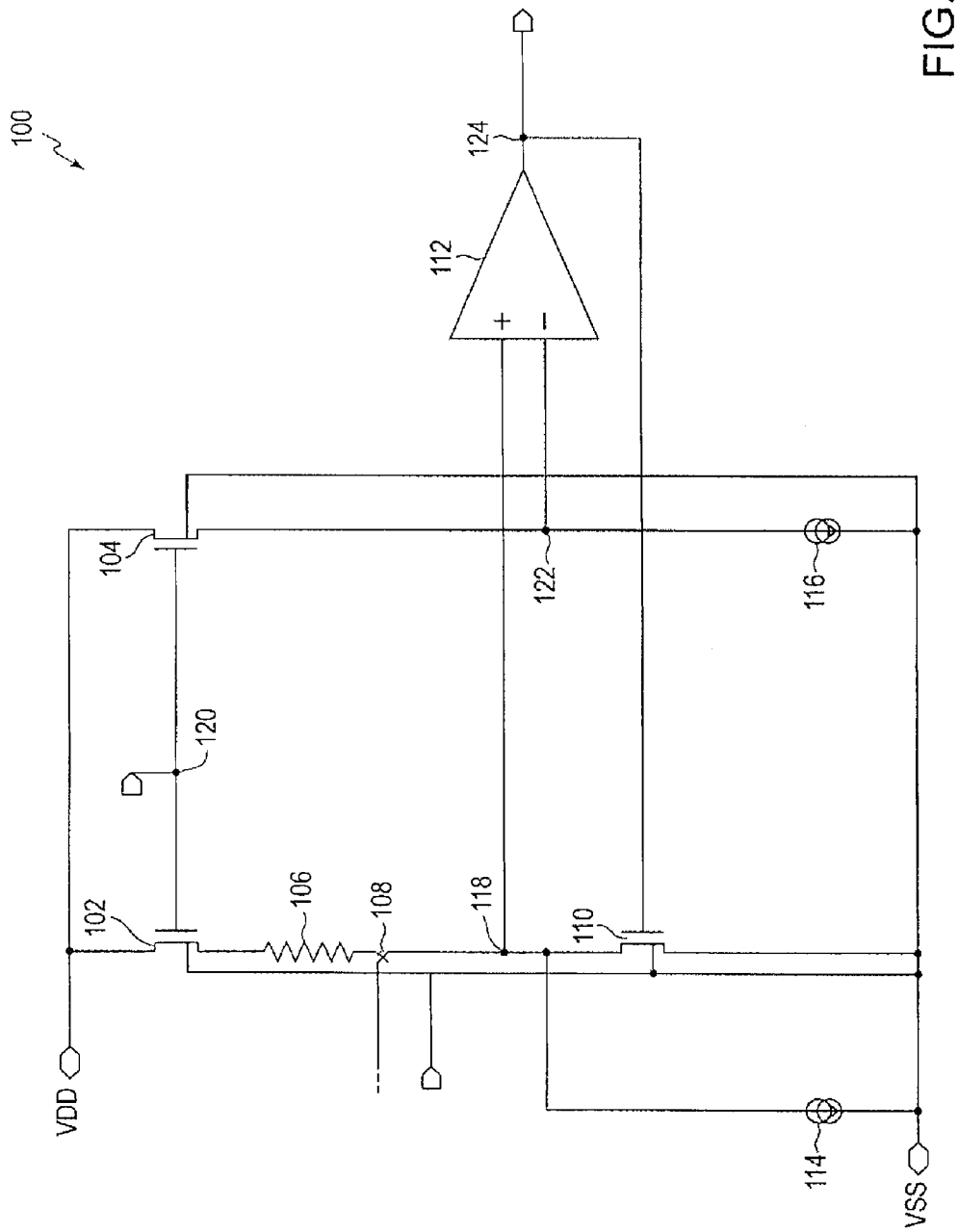
FIG. 1 is a schematic diagram of an example embodiment of an amplifier biasing circuit that reduces gain variation in short channel amplifiers.

FIG. 1 is a schematic diagram of an example embodiment of an amplifier biasing circuit that reduces gain variation in short channel amplifiers. As shown in FIG. 1, biasing circuit 100 includes a first cascode transistor 102, a second cascode transistor 104, a trim resistor 106, a mirror device transistor 110, an operational amplifier 112, a variable current source 114, and a constant current source 116. First cascode transistor 102 includes a gate terminal, a source terminal and a drain terminal. The channel length of the gate channel of first cascode transistor 102 may be the same as the channel length of the gate channel of second cascode transistor 104; however, the channel width to channel length ratio (W/L) of the gate channel of first cascode transistor 102 is greater, e.g., approximately 4 times greater, than the channel width to channel length ratio (W/L) of the gate channel of second cascode transistor 104. Second cascode transistor 104 includes a gate terminal, a source terminal and a drain terminal. Trim resistor 106 includes a current path first terminal, a current path second terminal and a trim control terminal 108. Mirror device transistor 110 includes a gate terminal, a source terminal and a drain terminal. Operational amplifier 112 includes a non-inverted input terminal, a inverted input terminal and an output terminal. Variable current source 114 includes a first terminal and a second terminal. Constant current source 116 includes a first terminal and a second terminal.

As further shown in FIG. 1, the drain terminal of cascode transistor 102 is connected to HIGH voltage source $V_{DD}$, the source terminal of cascode transistor 102 is connected to the current path first terminal of trim resistor 106, and the gate terminal of cascode transistor 102 is attached to the gate terminal of cascode transistor 104 at node 120, which may be connected to a threshold bias voltage source $V_{COS}$. The drain terminal of cascode transistor 104 is connected to HIGH voltage source $V_{DD}$, and the source terminal of cascode transistor 104 is connected to the inverted input terminal of operational amplifier 112 and the first terminal of constant current source 116 at node 122. The current path second terminal of trim resistor 106 is connected to the drain terminal of mirror device transistor 110, the non-inverted input terminal of operational amplifier 112, and the first terminal of variable current source 114 at node 118. The source terminal of mirror device transistor 110 is connected to LOW power source, $V_{SS}$, and the gate of mirror device transistor 110 is connected to the output terminal of operational amplifier 112 at node 124. The second terminal of constant current source 116 and the second terminal of variable current source 114 are connected to LOW power source, $V_{SS}$. In addition, the silicon substrate of cascode transistor 102, cascode transistor 104, and mirror device transistor 110 are connected to low voltage source, $V_{SS}$.

During operation, as process based circuit component characteristics and/or operating temperature causes the Gm of biasing circuit 100 to decrease, the gate-to-source voltage, Vgs, of cascode transistor 104 increases, since cascode transistor 104 sources a constant current. In response, operational amplifier 112 adjusts so that the gate-to-source voltage, Vgs, of cascode transistor 102 plus the voltage drop across trim resistor 106 increases by the same amount as the gate-to-source voltage, Vgs, of cascode transistor 104. Since the width to length ratio of cascode transistor 102 is larger than the width to length ratio of cascode transistor 104 the gate-to-source voltage, Vgs, of cascode transistor 102 will increase some, but not as much as the gate-to-source voltage, Vgs, of cascode transistor 104 due to the reduced current density in cascode transistor 102. Therefore, a portion of the increased voltage will be across trim resistor 106, thus, the bias current through trim resistor 106 will increase. The bias current is increased by increasing the gate voltage of mirror device transistor 110. This increases the bias point and the Gm of biasing circuit 100. Thus, the circuit adjusts to counteract changes in the Gm of the circuit due to, for example, circuit component performance characteristics at different operating temperature.

Unlike a true constant Gm circuit, as described below with respect to FIG. 10 and FIG. 11, biasing circuit 100 just pushes Gm back in the right direction rather than keeping the Gm exactly the same. Further, as described in greater detail below, biasing circuit 100 may include a variable current source that can add or remove current to/from the current coming down to mirror device transistor 110, thus adding additional control to the bias point. The drain-to-source voltage, Vds, of mirror device transistor 110 is controlled by the gate-to-source voltage, Vgs, of cascode transistor 104. As long as the fixed current produced by constant current source 116 is close to the bias current through mirror device transistor 110, the drain-to-source voltage of mirror device transistor 110 will be close enough to the drain-to-source voltage of the amplifier stage receiving the biasing signal generated by biasing circuit 100 to avoid mismatch due to short channel effects.

Bias circuit 100 reduces Gm variation, but does not set Gm exactly. Bias circuit 100 has a single feedback loop and a single stable point that does not require a start up circuit. Further, additional currents can be introduced without causing startup issues. The ability to add additional currents allows bias circuit 100 to account for other sources of gain variation. Bias circuit 100 can, in addition to changing the sizes of devices and the resistance value assigned to trim resistor 106, program variable and fixed currents which can be used to change the bias point and how bias circuit 100 reacts to changes in operating temperature. In one example embodiment, bias circuit 100 keeps the drain-to-source voltage, Vds, of the mirror device close to the drain-to-source voltage, Vds, of the gain device of the amplifier stage receiving a bias signal from bias circuit 100. This approach keeps mismatch due to short channel effects minimal but does not eliminate them. If a true constant Gm biasing signal is required, a biasing circuit, such as biasing circuit 1000, described with respect to FIG. 10 may be used.

Figure 2:
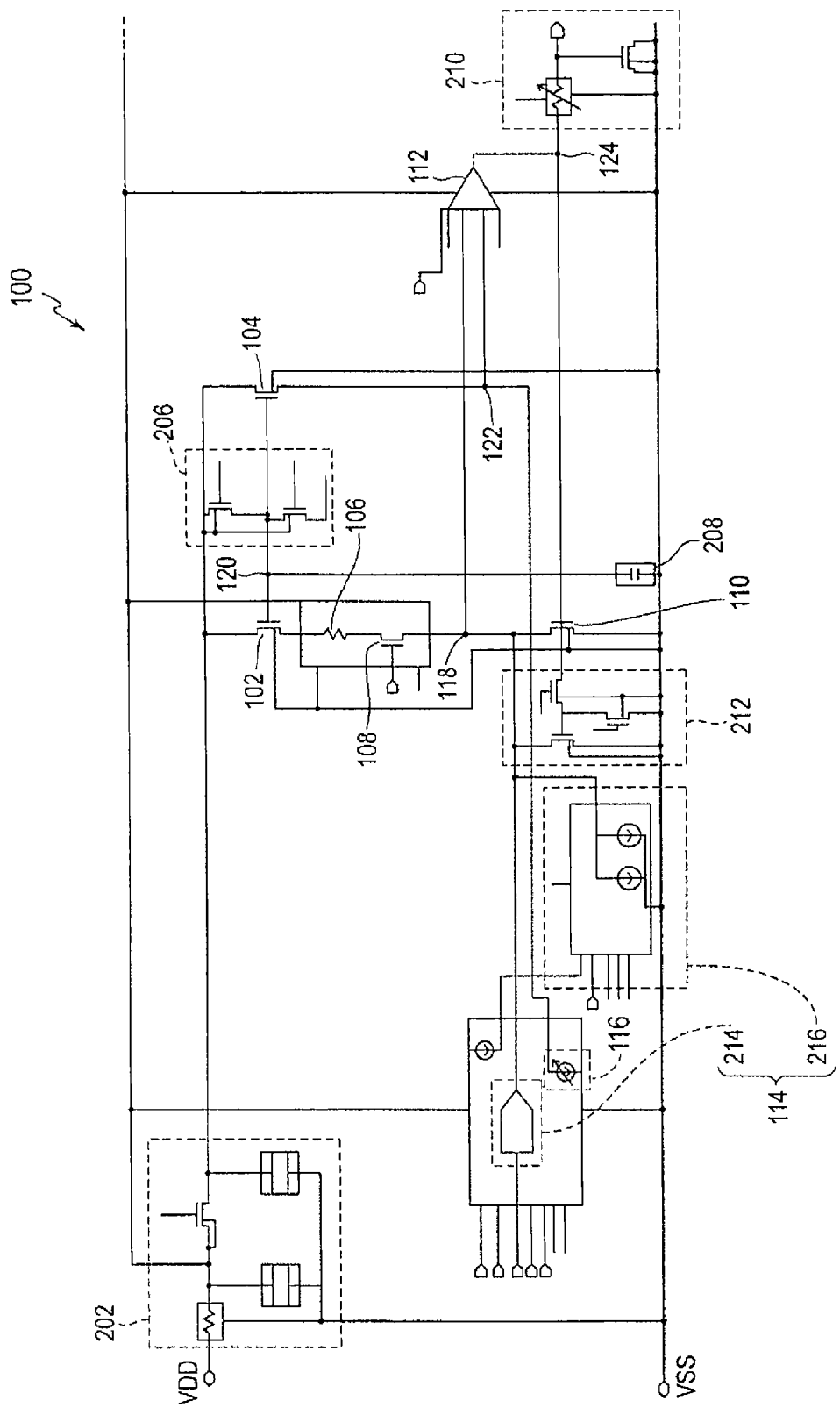
FIG. 2 is a more detailed schematic diagram of the amplifier biasing circuit shown in FIG. 1.

FIG. 2 is a schematic diagram of the amplifier biasing circuit described above with respect to FIG. 1, in which additional details are shown. Features described above with respect to FIG. 1 are identified with corresponding numeric labels. For example, first cascode transistor 102, second cascode transistor 104, trim resistor 106, mirror device transistor 110, operational amplifier 112, and constant current source 116 are depicted in a manner similar to that shown in FIG. 1, and therefore, are not further described. However, as shown in FIG. 2, biasing circuit 100 can include additional features such as HIGH source voltage filter/power-down circuit 202, a power-down switch 206, a cascode gate storage capacitor 208, a bias point low-pass filter 210, and an optional current tuning circuit 212. Further, as shown in FIG. 2, current source 114 can include additional features such as, a digital-to-analog converter (DAC) current source 214, and a Vdsat current source 216.

HIGH source voltage filter/power-down circuit 202 filters power received by biasing circuit 100 from HIGH source voltage, $V_{DD}$, and allows biasing circuit 100 to be disconnected from HIGH source voltage to support circuit power-down operations. Power-down circuit 206 allows the gates of the cascode transistor 102 and cascode transistor 104 to pulled HIGH or LOW, as needed, to support circuit configuration and/or circuit power-down operations. Cascode gate storage capacitor 208 is used during operation to maintain a gate voltage established across the gates of cascode transistor 102 and cascode transistor 104. Bias point low-pass filter 210 allows biasing circuit 100 to control the startup time of the amplifier.

Optional current tuning circuit 212 allows biasing circuit 100 to be manually configured as a constant gain biasing circuit that produces a constant Gm biasing signal for short channel amplifiers. For example, optional current tuning circuit 212 may be used to configure biasing circuit 100 to provide a constant gain biasing signal to an amplifier circuit in which gain variation is not a concern. In such an embodiment, current source 114 is disabled.

IDAC current source 214 receives a digital signal from one or more sensors, e.g., one or more temperature sensors, and adjusts a current applied to biasing circuit 100 at node 118 based on the magnitude of the one or more sensor values received. For example, in one example embodiment, IDAC current source 214 can adjust the amount of current supplied to biasing circuit 100 at node 118 whenever a change in the magnitude of any one of the one or more sensor values is detected.

Controlling a temperature based current can be performed by an IDAC current source 214 acting alone, or in combination with a Vdsat current source 216, as described below with respect to FIG. 3. If there is already an on chip temperature sensor that produces a digital code, then that digital code can be used to control IDAC current source 214. Digital logic may be used to convert a received digital temperature to a control code that can be used to control an amount of temperature dependent current output from IDAC current source 214. In one example embodiment, when used in combination with a Vdsat current source 216, the amplitude of the current produced by Vdsat current source 216 is dynamically chosen to adjust for process variation and current output from IDAC current source 214 is dynamically chosen to adjust for any additional temperature variation.

Vdsat current source 216 is configured to sink current from biasing circuit 100 at node 118 based on a sensed magnitude of the current supplied to biasing circuit 100 at node 118 from IDAC current source 214 and/or the current supplied to biasing circuit 100 at node 118 via trim resistor 106. For example, since the Gm of the amplifier may change in response to changes in operating conditions, e.g., changes in temperature, Vdsat current source 216 may be configured to compensate for such changes in the Gm of the amplifier by pulling current away from mirror device 110, as described below with respect to FIG. 8 and FIG. 9.

Figure 3:
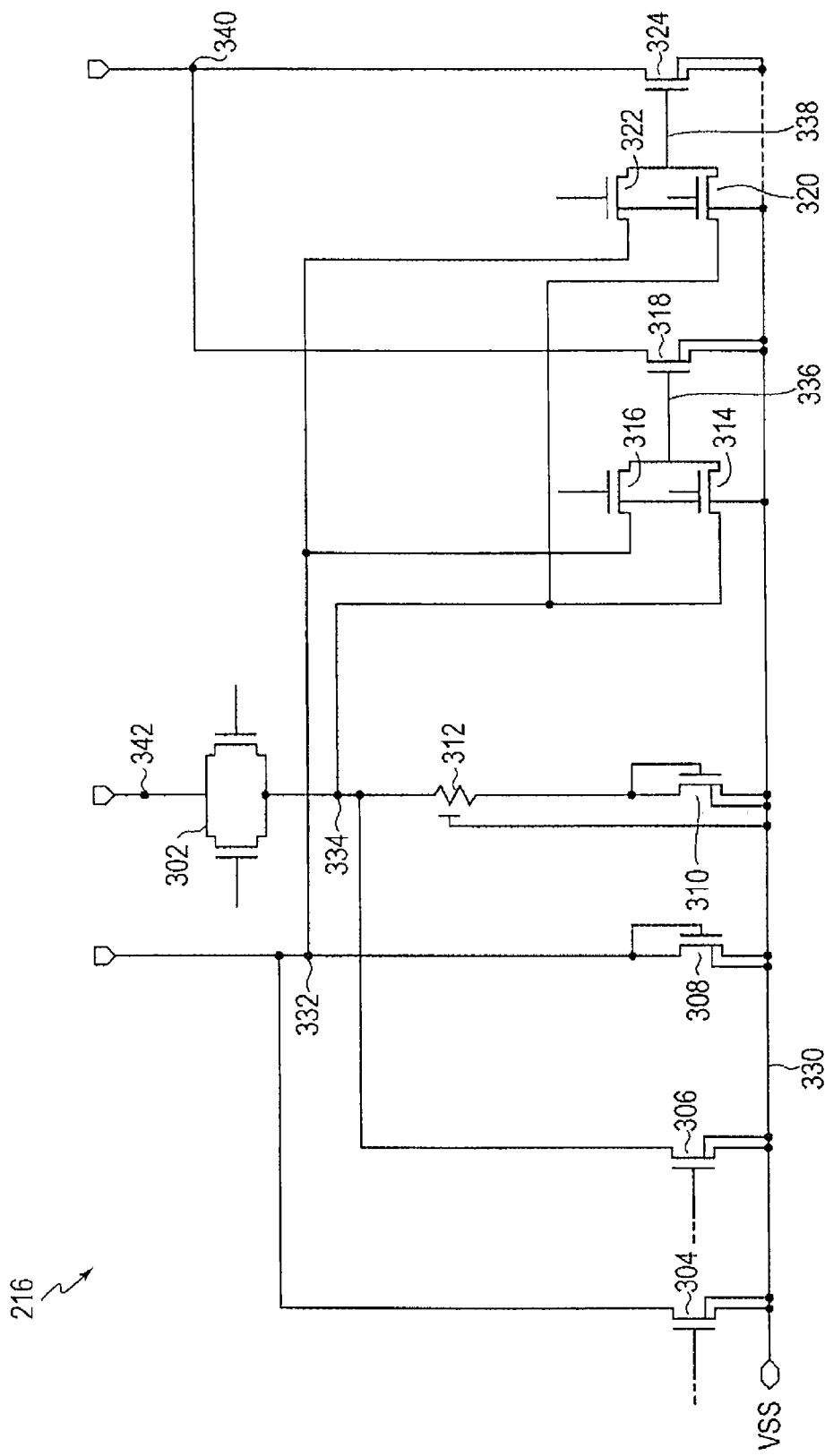
FIG. 3 is a more detailed schematic diagram of the Vdsat current source shown in FIG. 2.

FIG. 3 is a schematic diagram of Vdsat current source 216 described above with respect to FIG. 1 and FIG. 2, in which additional details are shown. Vdsat current source 216 monitors a current output from IDAC current source 214 to node 118 of biasing circuit 100 and monitors a current, or poly-current, received at node 118 from trim resistor 106 and draws current away from node 118 of biasing circuit 100, i.e., away from mirror device transistor 110, based on one or more of the monitored currents. For example, Vdsat current source 216 can be used to adjust the gain of a first amplifier stage to adjust for changes in a gain applied by a second amplifier stage, as described below with respect to FIG. 4.

As shown in FIG. 3, Vdsat current source 216 can include connect/disconnect switch 302, IDAC current over-bias control 304, poly-current over-bias control 306, current mirror 308, threshold voltage circuit 310, resistor 312, first poly-current control 314, first IDAC current control 316, first current mirror 318, second poly-current control 320, second IDAC current control 322, and second current mirror 324. Connect/disconnect switch 302, is connected between node 342 and node 334. IDAC current over-bias control 304 is connected between node 332 and node 330. Poly-current over-bias control 306 is connected between node 334 and node 330. Current mirror 308 is connected between node 332 and node 330. Resistor 312 is connected between node 334 and one of a source and a drain of threshold voltage circuit 310. The other of the source and drain of threshold voltage circuit 310 is connected to node 330. First poly-current control 314 is connected between node 334 and a gate of first current mirror 318. First IDAC current control 316 is connected between node 332 and the gate of first current mirror 318. First current mirror 318 is connected between node 340 and node 330. Second poly-current control 320 is connected between node 334 and a gate of second current mirror 324. Second IDAC current control 322 is connected between node 332 and the gate of second current mirror 324. Second current mirror 324 is connected between node 340 and node 330.

Vdsat current source 216 monitors the current supplied by IDAC current source 214 to node 118 of bias control circuit and optionally monitors the poly-current that passes through trim resistor 106 to node 118. The magnitude of the respective monitored currents is used to determine the amount of current that Vdsat current source 216 pulls from node 118.

For example, prior to operation, Vdsat current source 216 can be configured by a technician using the process flow described below with respect to FIG. 8 and FIG. 9. For example, Vdsat current source 216 is configured to monitor the poly-current through trim resistor 106, in addition to the IDAC current, by configuring the control leads connected to the gates of transistors in connect/disconnect switch 302 with binary signals that close connect/disconnect switch 302.

First current mirror 318 may be configured to mirror the IDAC current by applying binary control signals to first IDAC current control 316 and first poly-current control 314 that CLOSE first IDAC current control 316 and OPEN first poly-current control 314. First current mirror 318 may be configured to mirror the poly-current by applying binary control signals to first IDAC current control 316 and first poly-current control 314 that OPEN first IDAC current control 316 and CLOSE first poly-current control 314. Second current mirror 324 may be configured to mirror the IDAC current by applying binary control signals to second IDAC current control 322 and second poly-current control 320 that CLOSE second IDAC current control 322 and OPEN second poly-current control 320. Second current mirror 324 may be configured to mirror the poly-current by applying binary control signals to second IDAC current control 322 and second poly-current control 320 that OPEN second IDAC current control 322 and CLOSE second poly-current control 320.

To disable Vdsat current source 216 so that no current is pulled, binary control signals are applied to IDAC current over-bias control transistor 304 and IDAC current over-bias control transistor 306 to CLOSE both transistors. To enable Vdsat current source 216 so that current can be pulled, binary control signals are applied to IDAC current over-bias control transistor 304 and IDAC current over-bias control transistor 306 to OPEN both transistors. When Vdsat current source 216 is enabled, the dynamic current pulled through Vdsat current source 216 is determined by the combinations of binary control signals applied to first IDAC current control 316, first poly-current control 314, second IDAC current control 322 and second poly-current control 320, as described above.

Removing current from node 118 going to mirror device transistor 110 causes the bias point of biasing circuit 110 to move further in reaction to process and temperature. For example, the Gm of the mirror device will increase as temperature increases. Vdsat current source 216 is programmable to blend Vdsat current and constant current from IDAC current source 118, described above. This allows the degree of reaction to process and temperature to be programmed.

Figure 4:
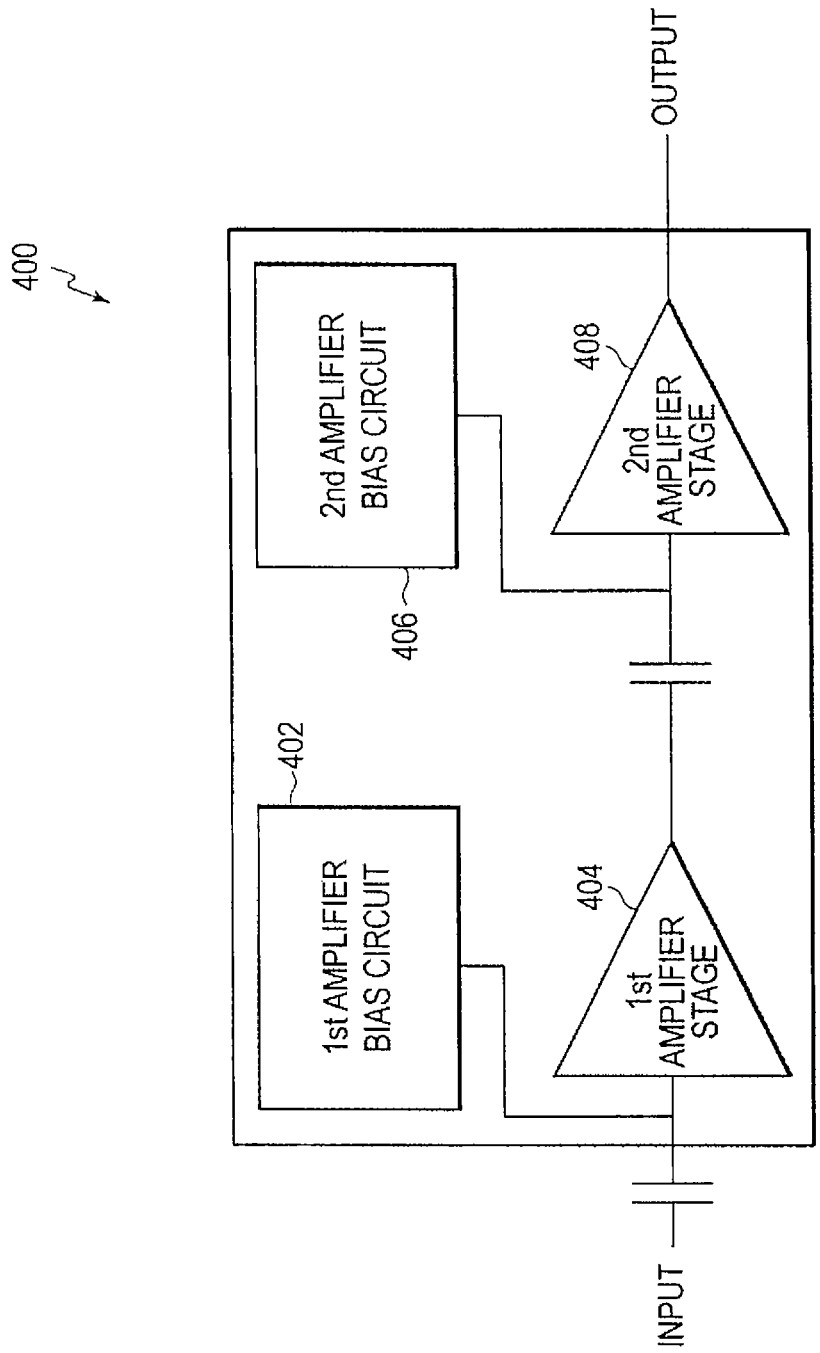
FIG. 4 is a block diagram of a multi-stage amplifier in which the bias signal provided to the first amplifier stage is produced by an example embodiment of the biasing circuit shown in FIG. 1, and in which the bias signal provided to the second amplifier stage is produced by an example embodiment of the biasing circuit shown in FIG. 10.

FIG. 4 is a block diagram of a multi-stage amplifier in which the bias signal provided to the first amplifier stage is produced by an example embodiment of biasing circuit 100, described above with respect to FIG. 1 through FIG. 3, and in which the bias signal provided to the second amplifier stage is produced by an example embodiment of the biasing circuit described below with respect to FIG. 10 and FIG. 11. As shown in FIG. 4, an example embodiment of multi-stage amplifier 400 includes a first amplifier bias circuit 402, first amplifier stage 404, second amplifier bias circuit 406 and second amplifier stage 408. Multi-stage amplifier 400 may be a high frequency amplifier, such as a radio frequency signal amplifier. To allow multi-stage amplifier 400 to amplify high frequency signals, each amplifier stage in multi-stage amplifier 400 may include short channel transistor devices, e.g., transistors in which the length of the transistor gate channel is approximately 60 nanometers (nm).

For example, in one example embodiment, first amplifier stage 404 may be a high frequency amplifier that includes a short channel transistor device as the Gm stage transistor of the amplifier. A bias signal produced by first amplifier bias circuit 402 as well as a capacitively coupled high frequency input signal may be applied to the gate terminal of the first amplifier stage 404. The bias signal biases the first amplifier stage 404 so that the amplifier can apply a gain to the received capacitively coupled high frequency signal. Further, second amplifier stage 408 may be a high frequency amplifier that includes a short channel transistor device as the Gm stage transistor of the amplifier. The capacitively coupled high frequency amplified output signal produced by first amplifier stage 404 as well as a bias signal produced by second amplifier bias circuit 402 are applied to the input gate terminal of second amplifier stage 408. The bias signal biases the second amplifier stage 408 so that the amplifier can apply a gain to the received capacitively coupled high frequency signal. As a result, the output of multi-stage amplifier 400 is the input signal received by first amplifier stage 404 times the gain of first amplifier stage 404 times the gain of second amplifier stage 408.

In one example embodiment of multi-stage amplifier 400, first amplifier bias circuit 402 may be an amplifier bias circuit that reduces gain variation in short channel amplifiers such as that described above with respect to FIG. 1 through FIG. 3, and second amplifier bias circuit 406 may be an amplifier that produces a constant Gm biasing signal for short channel amplifiers such as that described below with respect to FIG. 10 and FIG. 11.

It is noted that the two stage, multi-stage amplifier described above with respect to FIG. 4 is exemplary only. Other example multi-stage amplifier embodiments may have more than two amplifier stages. Depending on the desired characteristics of the final multi-stage amplifier output signal, and the characteristics of the respective amplifier stages under the operating conditions in which the multi-stage amplifier is used, the biasing circuits used to supply a biasing signal to the respective amplifier stages may be a biasing circuit that reduces gain variation in short channel amplifiers, as described above with respect to FIG. 1 through FIG. 3, or a biasing circuit that produces a constant Gm biasing signal for short channel amplifiers, as described below with respect to FIG. 10 and FIG. 11, or some other bias circuit, such as a constant current bias.

For example, one or more amplifier stages within the multistage amplifier may be biased using an embodiment of the biasing circuit described below with respect to FIG. 1 through FIG. 3, in which the respective biasing circuits are configured to over compensate for process and temperature variations in subsequent amplifier stages that can affect the performance of the multistage amplifier, as described below. One or more other amplifier stages may be biased for constant Gm using an embodiment of the biasing circuit such as biasing circuit described below with respect to FIG. 10 and FIG. 11. The number of amplifier stages, the type of biasing circuit used to bias each, and the manner in which each biasing circuit is configured, may be driven by the amplification requirements to be met by the multi-stage amplifier and the operational environment in which the multi-stage will be used.

For example, by adjusting the current put into bias circuit 100 at node 118 based on a measured temperature, IDAC current source 214 may compensate for changes in performance of components within the same or subsequent amplifier stages, such as inductors and other components, that are temperature sensitive. Further, by adjusting the current pulled from bias circuit 100 at node 118 based on one or both of the IDAC supplied current supplied to node 118 and the poly-current supplied to node 118 of bias circuit 100 via trim resistor 106, Vdsat current source 216 of first amplifier bias circuit 402 may be configured to compensate for variations in the Gm of the same or subsequent amplifier stages.

Figure 5:
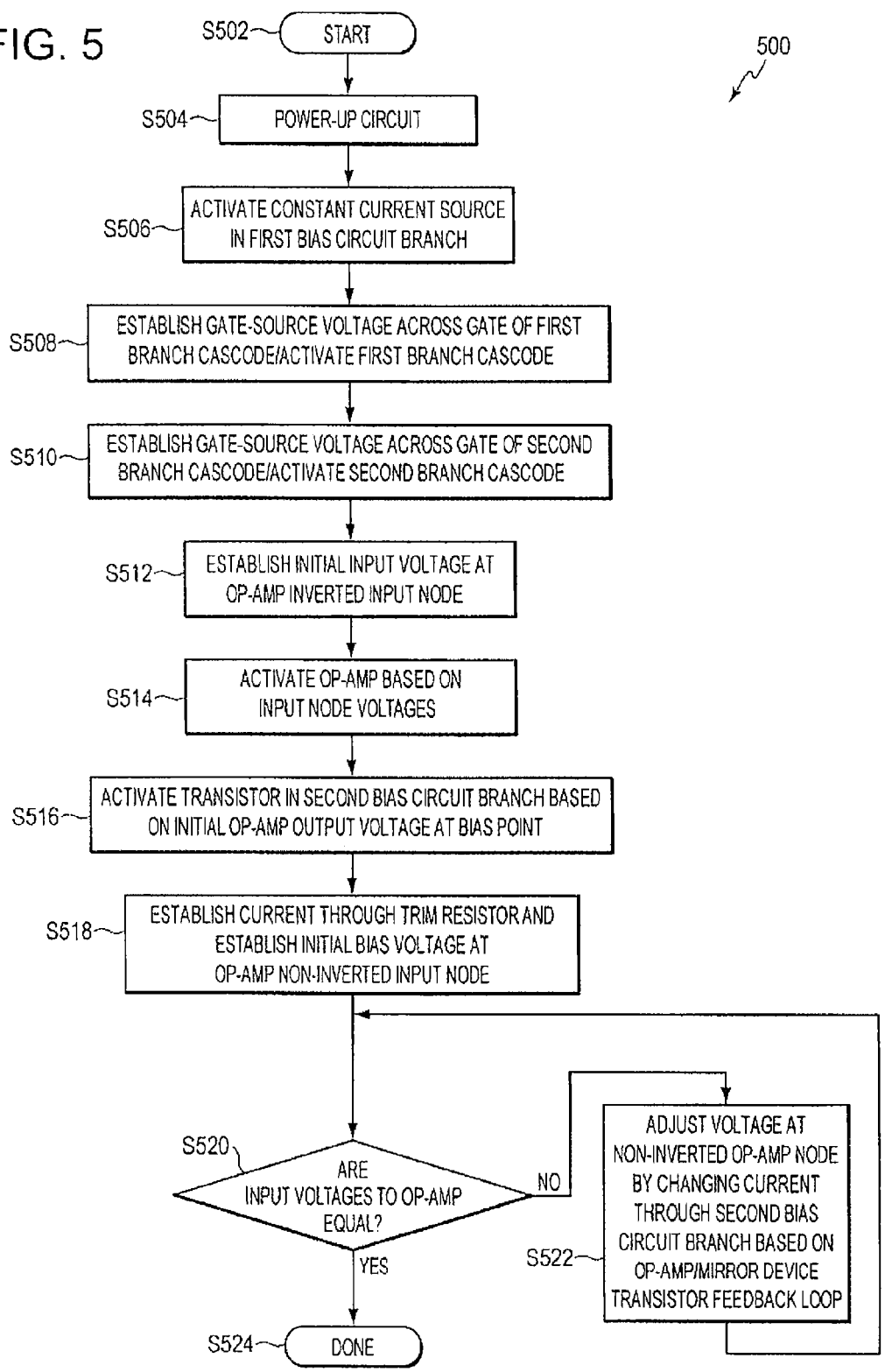
FIG. 5 a flow-chart of a process for starting up an example embodiment of the amplifier biasing circuit shown in FIG. 1.

FIG. 5 a flow-chart of a process for starting up an example embodiment of the amplifier biasing circuit shown in FIG. 1 through FIG. 3. As shown in FIG. 5, operation of the process begins at S502 and proceeds to S504.

At S504, power is supplied to bias circuit 100, and operation of the process continues at S506.

At S506, constant current source 116 may be activated to supply a constant current through a first branch of bias circuit 100 that includes cascode transistor 104 and constant current source 116, and operation of the process continues at S508.

At S508, the current established by constant current source 116 establishes a gate-source voltage across the gate of cascode transistor 104, thereby closing cascode transistor 104, and operation of the process continues at S510.

At S510, the voltage established across the gate of cascode transistor 104 at S508, results in a voltage at node 120 and establishes a gate-source voltage across the gate of cascode transistor 102, thereby closing cascode transistor 102, and operation of the process continues at S512.

At S512, an initial voltage is established at node 122 on the inverted input node of operational amplifier 112, and operation of the process continues at S514.

At S514, a voltage difference between the voltages applied at the input nodes of operational amplifier 112 activates operational amplifier 112, and operation of the process continues at S516.

At S516, mirror device transistor 110 is closed by the bias voltage generated at the output node of operational amplifier 112 at node 124 and operation of the process continues at S518.

At S518, a current is allowed to pass through trim resistor 106 to establish a voltage at node 118 and the non-inverted input node of operational amplifier 112, and operation of the process continues at S520.

At S520, if operational amplifier 112 determines that a difference between the voltage at node 118 and the voltage at node 122 is zero, operation of the process terminates at S524; otherwise, operation of the process continues at S522.

At S522, operational amplifier 112 adjusts the output of operational amplifier 112 at node 124 based on the difference between the voltages applied to the two respective input nodes of operational amplifier 112 at node 118 and at node 122, and operation of the process continues at S520.

At S520 and S522, above, a feedback loop is established between node 124 and node 118 that includes operational amplifier 112 and mirror device transistor 110. Operational amplifier 112 continues to adjust the voltage at node 124, until the input voltage at node 118 is again equal to the input voltage at node 122. Once the difference between the input voltage at node 118 and the input voltage at node 122 is zero, the bias circuit initialization process is complete.

It is noted that in the startup process for biasing circuit 100, the voltage at node 122 is the high voltage supply, $V_{DD}$, minus the gate-to-source voltage, Vgs, of cascode transistor 104 based on the constant current produced by constant current source 116. There is no feedback in this half of the circuit. The only feedback loop is the feedback loop that contains operational amplifier 112, node 124, mirror device transistor 110, and node 118 which is connected to the non-inverting input terminal of operational amplifier 112. Since there is only the one negative feedback loop startup and stability are easy to analyze. Startup does not depend on the current being added to, or subtracted from node 118 by variable current source 114. If the output of operational amplifier 112 at node 124 is high, the non-inverting input will be low, causing the output to come down. If the output of operational amplifier 112 at node 124 is low, the non-inverting input will be high, causing the output to come up.

Figure 6:
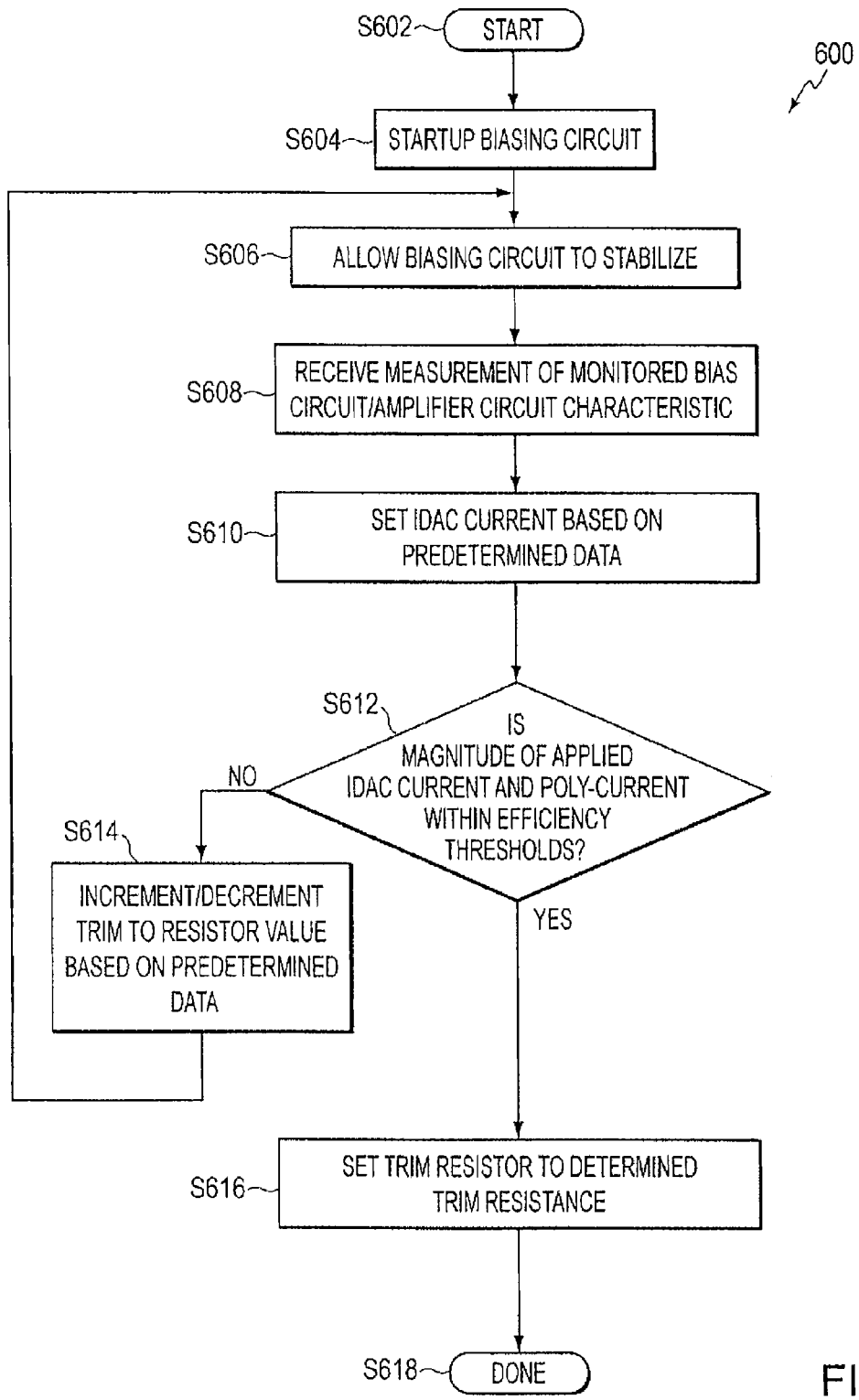
FIG. 6 a flow-chart of a process that may be used by a technician to configure an example embodiment of the amplifier biasing circuit shown in FIG. 1 with a baseline constant current and a tuned resistor.

FIG. 6 is a flow-chart of a manual process that may be performed by a technician to determine an appropriate resistor value for trim resistor 106 within a specific implementation of bias circuit 100, e.g., an implementation of bias circuit 100 within a two-stage amplifier, such as multi-stage amplifier 400 described above with respect to FIG. 4. Once the trim value is determined using the process shown in FIG. 6, the same trim value may be used to configure similarly configured circuits. As shown in FIG. 6, operation of the process begins at S602 and proceeds to S604.

At S604, bias circuit 100 is started as described above with respect to FIG. 5, and operation of the process continues at S606.

At S606, bias circuit 100 is allowed to stabilize, and operation of the process continues at S608.

At S608, IDAC current source 214 receives a measure of a physical operational characteristic of bias circuit 100 and/or an amplifier stage operational characteristic, e.g., such as a temperature, from a sensor, e.g., a digital sensor, that provides input to IDAC current source 214, and operation of the process continues at S610.

At S610, IDAC current source 214 sets a magnitude of an IDAC current supplied by IDAC current source 214 to node 118 of biasing circuit 100. The magnitude of the IDAC current is determined based on the value of the measurement received at S608 and stored data, e.g., lookup tables containing previously determined current values for respective sensor measurement values, and operation of the process continues at S612.

At S612, a technician determines a magnitude of the applied IDAC current and the poly-current received at node 118 of bias circuit 100, and decides whether the current levels are acceptable. If the current levels are acceptable, operation of the process continues at S616; otherwise, operation of the process continues at S614.

At S614, the technician increments or decrements the resistor value, i.e., trims the resistor value, assigned to trim resistor 106, and operation of the process continues at S606.

At S616, the technician permanently assigns the determined resistor value to trim resistor 106, and operation of the process terminates at S618.

Figure 7:
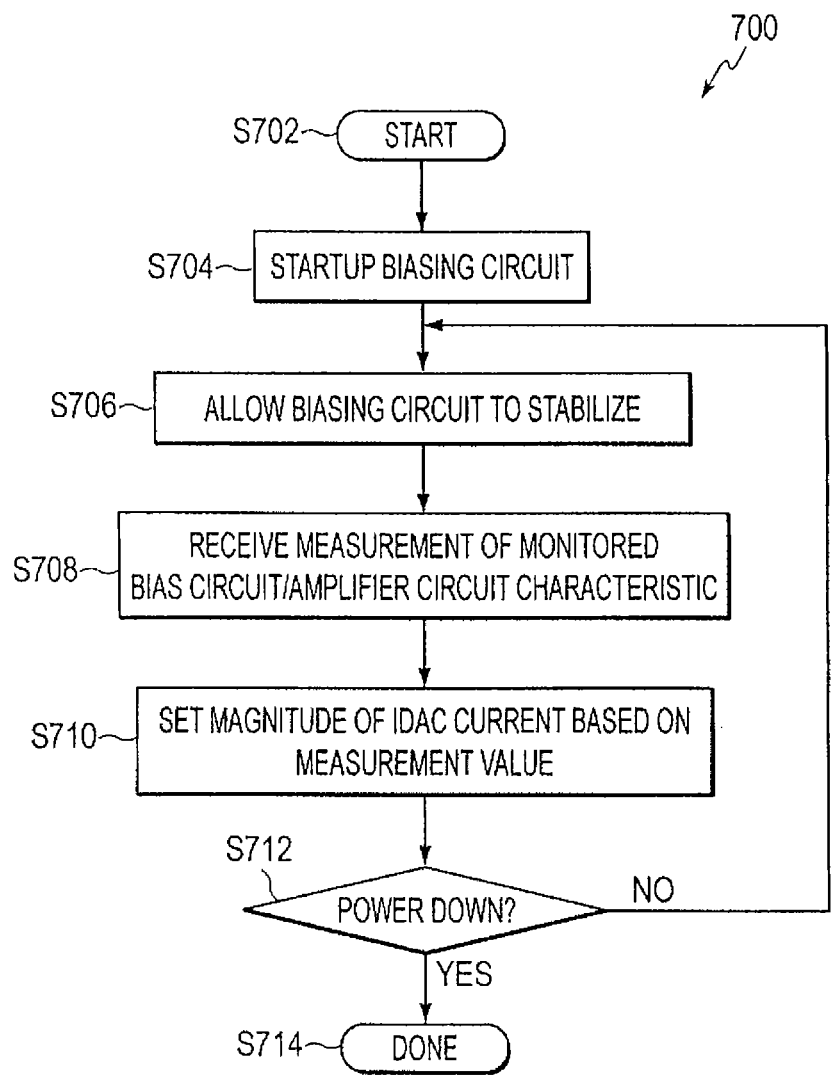
FIG. 7 a flow-chart of a process for adjusting a current level in an example embodiment of the amplifier biasing circuit shown in FIG. 1 in response to input from a monitoring sensor.

FIG. 7 a flow-chart of a process used by an example embodiment of biasing circuit 100 to adjust the magnitude of the current applied to bias circuit 100 at node 118 by IDAC current source 214. The process is performed automatically by biasing circuit and assumes that the value of trim resistor 106 has already been determined and applied to trim resistor 106, as described above with respect to FIG. 6. As shown in FIG. 7, operation of the process begins at S702 and proceeds to S704.

At S704, bias circuit 100 is started as described above with respect to FIG. 5, and operation of the process continues at S706.

At S706, bias circuit 100 is allowed to stabilize, and operation of the process continues at S708.

At S708, IDAC current source 214 receives a measure of a physical operational characteristic of bias circuit 100 and/or an amplifier stage operational characteristic, e.g., such as a temperature, from a sensor, e.g., a digital sensor, that provides input to IDAC current source 214, and operation of the process continues at S710.

At S710, IDAC current source 214 sets a magnitude of an IDAC current supplied by IDAC current source 214 to node 118 of biasing circuit 100. The magnitude of the IDAC current is determined based on the value of the measurement received at S708 and stored data, e.g., lookup tables containing previously determined current values for respective sensor measurement values, and operation of the process continues at S712.

At S712, if a power-down condition is detected, operation of the process terminates at S712, otherwise; operation of the process continues at S706.

Figure 8:
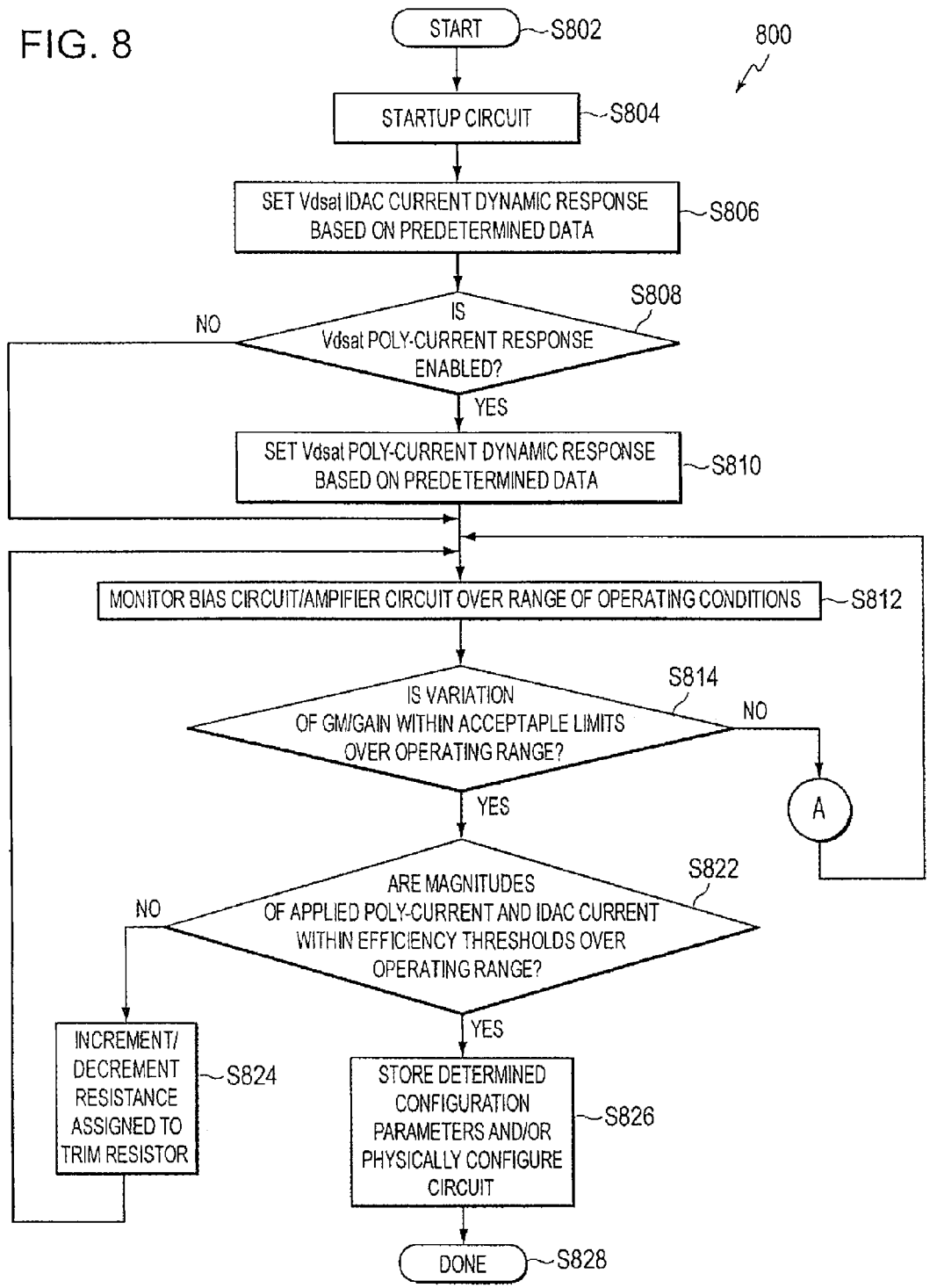
FIG. 8 and FIG. 9 are a flow-chart of a process that may be used by a technician to tune an example embodiment of the amplifier biasing circuit shown in FIG. 1.
Figure 9:
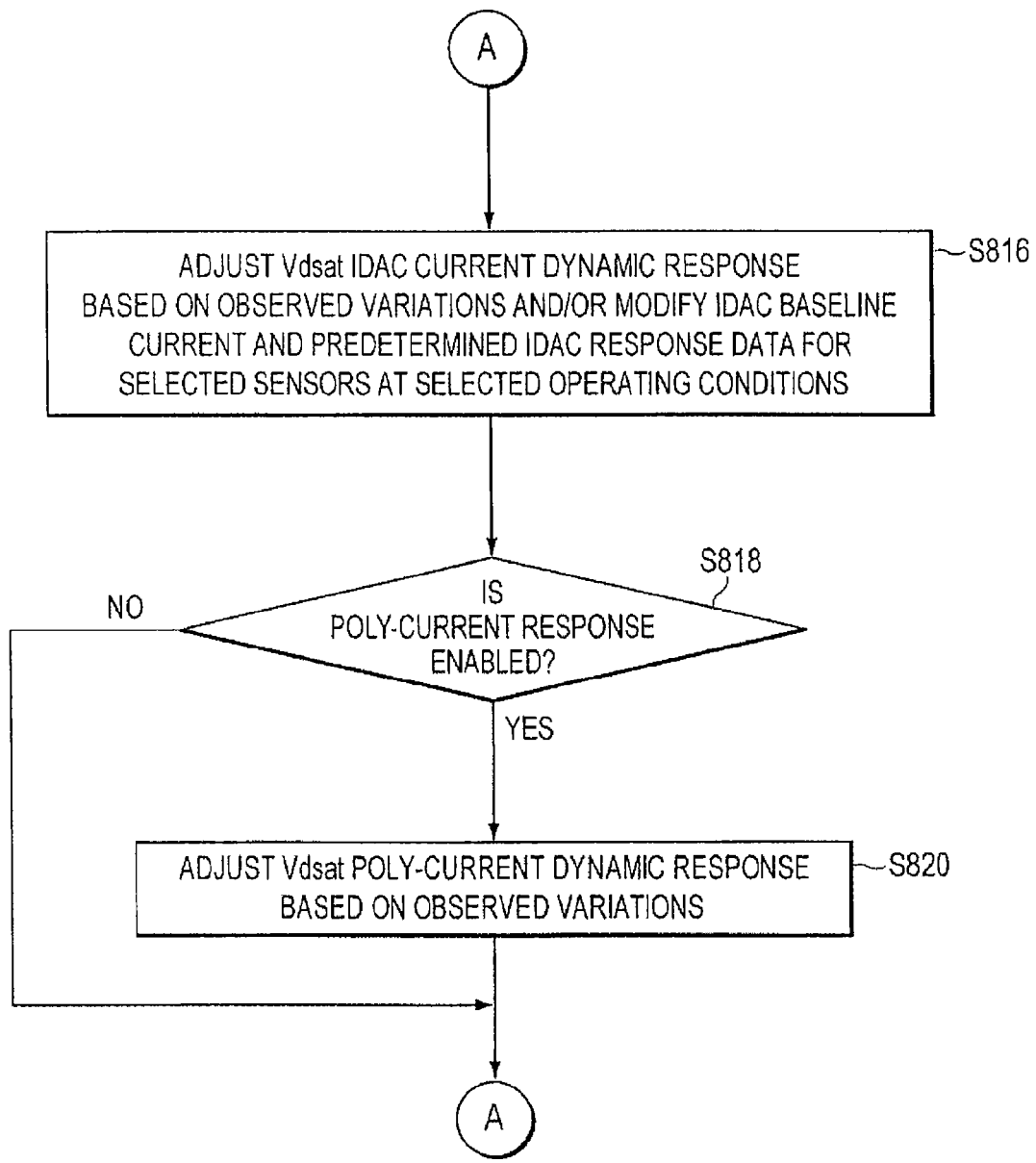

FIG. 8 and FIG. 9 are a flow-chart of a manual process that may be used by a technician to tune an example embodiment of bias circuit 100 that includes both an IDAC current source 214 and a Vdsat current source 216, such as the IDAC current source 214 and the Vdsat current source 216 described above with respect to FIG. 2 and FIG. 3. The process below assumes that the example bias circuit 100 has been included in an amplifier circuit, such as amplifier circuit 400 described above with respect to FIG. 4. In one example embodiment, once the respective control values are determined, the control parameters may be stored as data that may be applied to Vdsat current source 216 and/or IDAC current source 214 at runtime. In another example embodiment, once the respective control values have been determined, only the control parameters for the IDAC current source 214 are stored as data. The Vdsat current source 216 is modified to permanently apply the determined control values. Once the Vdsat control parameters have been determined for a specific amplifier circuit embodiment, the same control parameters can be applied to similarly configured circuits. In the process described below, it is assumed that the resistor value for trim transistor 106 has not yet been determined, i.e., the process described above with respect to FIG. 6 has not been implemented. As shown in FIG. 8, operation of the process begins at S802 and proceeds to S804.

At S804, the amplifier circuit is powered up, as described above with respect to FIG. 5, and operation of the process continues at S806

At S806, the control leads of Vdsat current source 216 related to the generation of a Vdsat current based on the IDAC current produced by IDAC current source 214, as described above with respect to FIG. 3, are set to an initial configuration selected by the technician based on predetermined data, and operation of the process continues at S808.

At S808, if Vdsat current source 216 is configured to monitor the poly-current through trim resistor 106, as described above with respect to FIG. 3, operation of the process continues at S810; otherwise, operation of the process continues at S812.

At S810, the control leads of Vdsat current source 216 related to the generation of a Vdsat current based on the poly-current that passes through trim resistor 106, as described above with respect to FIG. 3, are set to an initial configuration selected by the technician based on predetermined data, and operation of the process continues at S812.

At S812, Vdsat current source 216 monitors the IDAC current, and optionally, the poly-current, over a range of operating conditions, e.g., changes in operating temperatures, and operation of the process continues at S814.

At S814, if the technician observes a variation of Gm and/or amplifier gain at either the output of first amplifier stage 404 or second amplifier stage 408 that exceeds an acceptable limit over the observed operating range, operation of the process continues at S816 (as shown in FIG. 9); otherwise, operation of the process continues at S822.

At S816, the technician changes one or more of the Vdsat IDAC current based contribution to a first Vdsat current flow, e.g., through transistor 318 shown in FIG. 3, the Vdsat IDAC current based contribution to a second Vdsat current flow, e.g., through transistor 324 shown in FIG. 3, the baseline IDAC current and/or the IDAC response current for one or more selected IDAC sensors for one or more selected operational conditions, e.g., at one or more temperatures, and operation of the process continues at S818.

At S818, if Vdsat current source 216 is configured to monitor the poly-current through trim resistor 106, as described above with respect to FIG. 3, operation of the process continues at S820; otherwise, operation of the process continues at S812.

At S820, the technician changes one or more of the Vdsat poly-current based contribution to the first Vdsat current flow, and/or the Vdsat poly-current based contribution to the second Vdsat current flow, and operation of the process continues at S812.

At S822, if the technician determines that the magnitude of the applied Vdsat current and the magnitude of the applied IDAC current are within established efficiency thresholds over the range of operational conditions, e.g., the range of operational temperatures, operation of the process continues at S826; otherwise, operation of the process continues at S824.

At S824, the technician increments or decrements the trim resistor value assigned to trim resistor 106, and operation of the process continues at S812.

At S826, the technician stores the determined configuration parameters and/or physically configures the circuit based on the determined parameters, and operation of the process terminates at S828.

Figure 10:
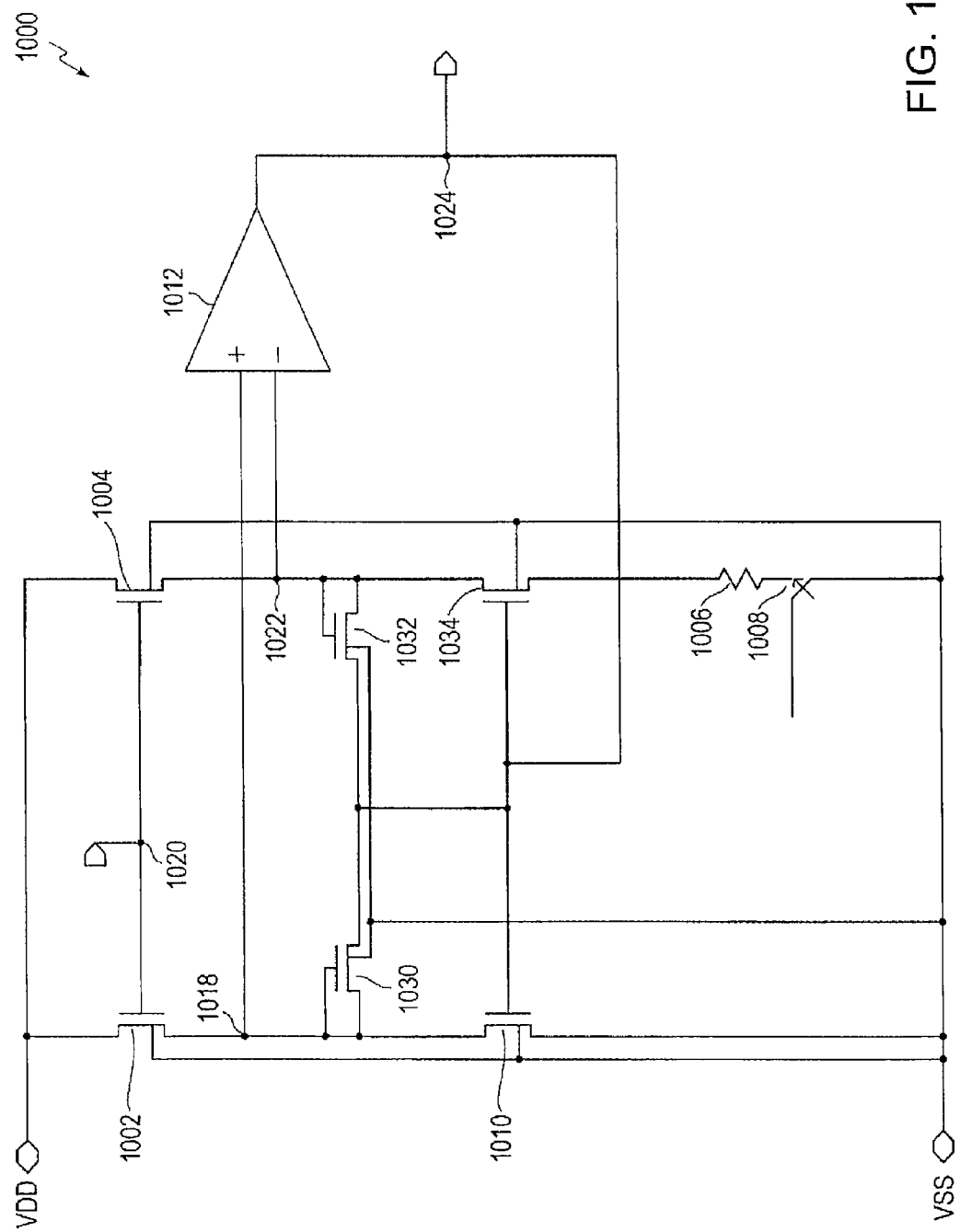
FIG. 10 is a schematic diagram of an example embodiment of an amplifier biasing circuit that produces a constant Gm biasing signal for short channel amplifiers.

FIG. 10 is a schematic diagram of an example embodiment of an amplifier biasing circuit that produces a constant Gm biasing signal for short channel amplifiers, as described above with respect to FIG. 4. As shown in FIG. 1, biasing circuit 1000 can include a first cascode transistor 1002, a second cascode transistor 1004 that is substantially identical to the first cascode transistor 1002, a trim resistor 1006, a mirror device transistor 1010, an operational amplifier 1012, a first startup/protection diode transistor 1030, a second startup/protection diode transistor 1032, and a transistor 1034. First cascode transistor 1002 includes a gate terminal, a source terminal and a drain terminal. Second cascode transistor 1004 includes a gate terminal, a source terminal and a drain terminal. Trim resistor 1006 includes a current path first terminal, a current path second terminal and a trim control terminal 1008. Mirror device transistor 1010 includes a gate terminal, a source terminal and a drain terminal. Operational amplifier 1012 includes a non-inverting input terminal, an inverting input terminal and an output terminal. First startup/protection diode transistor 1030 includes a gate terminal, a source terminal and a drain terminal. Second startup/protection diode transistor 1032 includes a gate terminal, a source terminal and a drain terminal. Transistor 1034 includes a gate terminal, a source terminal and a drain terminal. In one example embodiment, the channel length of the gate channel of transistor 1034 can be approximately the same as the channel length of the gate channel of mirror device transistor 1010; however, the width of the gate channel of transistor 1034 can be greater, e.g., 4 times greater, than the width of the gate channel of mirror device transistor 110. As a result, the width-to-length ratio of transistor 1034 can be approximately 4 times the width-to-length ratio of mirror device transistor 1010, for reasons described below with respect to equation 1 through equation 6. Further, as described below with respect to FIG. 11, in one example embodiment, the equivalent width of the gate channel of transistor 1034 can be configurable, thereby allowing the Gm of biasing circuit 1000 to be adjusted.

As further shown in FIG. 10, the drain terminal of cascode transistor 1002 is connected to HIGH voltage source $V_{DD}$, the source terminal of cascode transistor 1002 is connected to node 1018, and the gate terminal of cascode transistor 1002 is connected to the gate terminal of cascode transistor 1004 at node 1020. The drain terminal of cascode transistor 1004 is connected to HIGH voltage source $V_{DD}$, and the source terminal of cascode transistor 1004 is connected to node 1022. The drain terminal and gate terminal of first startup/protection diode transistor 1030 is connected to node 1018, and the source terminal of first startup/protection diode transistor 1030 is connected to the source terminal of second startup/protection diode transistor 1032 at node 1024. The drain terminal and gate terminal of second startup/protection diode transistor 1032 is connected to node 1022. The drain of mirror transistor device 1010 is connected to node 1018, the source terminal of mirror transistor device 1010 is connected to LOW voltage source $V_{SS}$, and the gate terminal of mirror transistor device 1010 is connected to the gate terminal of transistor 1034 at node 1024. The drain terminal of transistor 1034 is connected to node 1022, and the source terminal of transistor 1034 is connected to the current path first terminal of trim resistor 1006. The current path second terminal of trim resistor 1006 is connected to LOW voltage source $V_{ss}$. The first input node of operational amplifier 1012 is connected to node 1018, the second input node of operational amplifier 1012 is connected to node 1022, and the output node of operational amplifier 1012 is connected to node 1024.

Startup of biasing circuit 1000 is described in detail below with respect to FIG. 12. It is noted, however, that startup/protection diode transistor 1030 and startup/protection diode transistor 1032 play a role in the startup of biasing circuit 1000. Startup/protection diode transistor 1030 and startup/protection diode transistor 1032 prevent the voltage at node 1024 from dropping to zero, which would prevent mirror transistor device 1010 and drain terminal of transistor 1034 from passing any current, and the voltage at node 1018 and node 1022 would be set at equal, full HIGH values. Since the voltage at node 1018 and node 1022 would be equal, operational amplifier 1012 would be deactivated. Therefore, startup/protection diode transistor 1030 and startup/protection diode transistor 1032 prevent such a state from occurring. If the output of operational amplifier 1012 is LOW, the respective diodes turn on and pull up the operational amplifier output at node 1024. Further, if the voltage at node 1024 is high, mirror transistor device 1010 will sink a large current, thereby pulling the non-inverted input terminal of operational amplifier 1012 low, and transistor 1034 will sink a limited current so that the inverted input terminal of operational amplifier 1012 is not as low as the non-inverted input terminal of operational amplifier 1012, thereby causing operational amplifier 1012 to move away from such a high output state.

Figure 11:
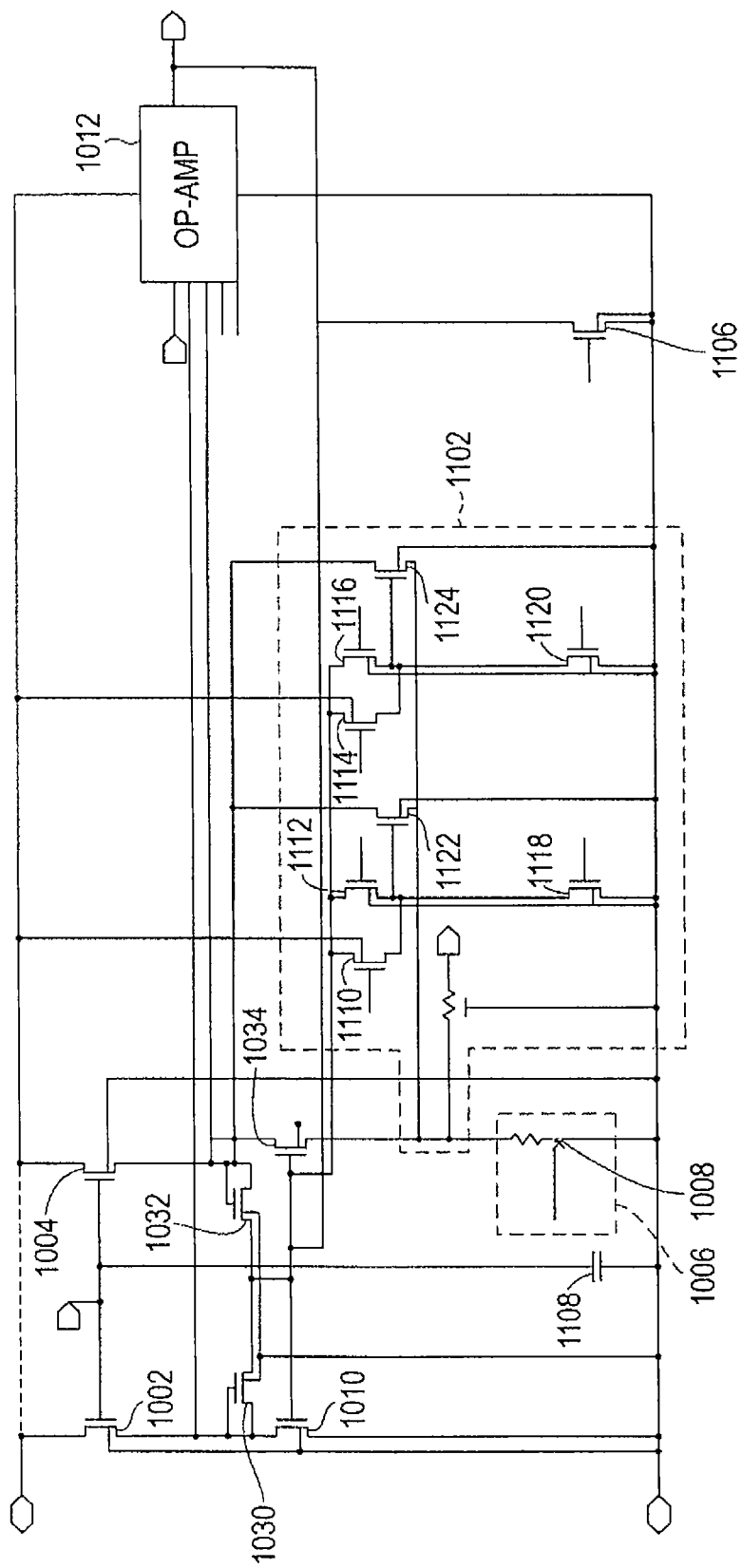
FIG. 11 is a more detailed schematic diagram of the amplifier biasing circuit shown in FIG. 10.

FIG. 11 is a schematic diagram of the amplifier biasing circuit described above with respect to FIG. 10, in which additional details are shown. Features described above with respect to FIG. 10 are identified with corresponding numeric labels. For example, first cascode transistor 1002, a second cascode transistor 1004, a trim resistor 1006, a mirror device transistor 1010, an operational amplifier 1012, a first startup/protection diode transistor 1030, a second startup/protection diode transistor 1032, and a transistor 1034 are depicted in a manner similar to that shown in FIG. 10, and therefore, are not further described. However, as shown in FIG. 11, biasing circuit 1000 can include additional features such as a power-down switch 1106, a cascode gate storage capacitor 1108, and an optional tuning circuit 1102.

Power-down circuit 1106 allows the gates of mirror device transistor 1010 and transistor 1034 to pulled LOW, as needed, to support circuit configuration and/or circuit power-down operations. Cascode gate storage capacitor 1108 is used during operation to maintain a gate voltage established across the gates of cascode transistor 1002 and cascode transistor 1004.

Optional tuning circuit 1102 is used to increase the effective gate width, i.e., reduce the effective resistance of transistor 1034, as needed, to support various circuit configuration requirements. For example, as shown in FIG. 11, transistor 1122 of optional tuning circuit 1102 is configured in parallel with transistor 1034. When OPEN, transistor 1122 will not pass any current or have any effect on bias circuit 1000. However, if transistor 1122 is fully CLOSED, additional current is able to pass from node 1022 to trim resistor 1006 in parallel with transistor 1034. This has the effect of increasing the effective width of transistor 1034.

As shown in FIG. 11, if transistor 1118 is CLOSED, the gate of transistor 1122 will be connected to LOW voltage source, $V_{SS}$, and transistor 1122 will be held OPEN, and, therefore will not affect operation of circuit 1000. However, if 1118 is OPENED, control signals applied to one or more of the gates of transistor 1110 or transistor 1112 allow the gate of transistor 1122 to be connected to the gate of transistor 1034 and may be controlled to operate in parallel with transistor 1034, the current through transistor 1122 based on the magnitude of the control signals applied to transistor 1110 or transistor 1112. Similarly, if transistor 1120 is CLOSED, the gate of transistor 1124 will be connected to LOW voltage source, $V_{SS}$, and transistor 1124 will be held OPEN, and, therefore will not affect operation of circuit 1000. However, if 1120 is OPENED, control signals applied to one or more of the gates of transistor 1114 or transistor 1116 allow the gate of transistor 1124 to be connected to the gate of transistor 1034 and may be controlled to operate in parallel with transistor 1034, the current through transistor 1124 based on the magnitude of the control signals applied to transistor 1114 or transistor 1116. In this manner, optional tuning circuit 1102 can be used to adjust the effective channel width of transistor 1034.

Bias circuit 1000 is a constant Gm bias circuit in which the Gm of the circuit is set by the resistance value of trim resistor 1006 and the ratio of the channel width-to-length ratios of mirror device transistor 1010 and transistor 1034. The resistance of trim resistor 1006 may be configured with trim control terminal 1008, and the channel width of transistor 1034 may be configured with optional tuning circuit 1102 to adjust the Gm of the circuit. To avoid current mismatches, or random offset, due to short channel effects, bias circuit 1000 maintains the same drain-to-source voltage, Vds, across mirror device transistor 1010 as the drain-to-source voltage, Vds, of the gain device of the amplifier stage receiving a bias signal from bias circuit 1000. Although the Gm of bias circuit 1000 can be controlled in such a manner, bias circuit 1000 is unable to further adjust the bias signal generated in response to process and temperature changes. If a single-stage amplifier circuit requires the ability to adjust the bias signal in response to process and temperature changes, bias circuit 100 may be use in place of bias circuit 1000. If a multi-stage-stage amplifier circuit requires the ability to adjust the gain of the multi-stage amplifier in response to process and temperature changes, bias circuit 100 may be used to provide a biasing signal to one of the amplifier stages in the multi-stage amplifier, as described above with respect to FIG. 4, and bias circuit 100 may be adjusted to over compensate for the amplifier stage receiving a biasing signal from bias circuit 1000.

Figure 12:
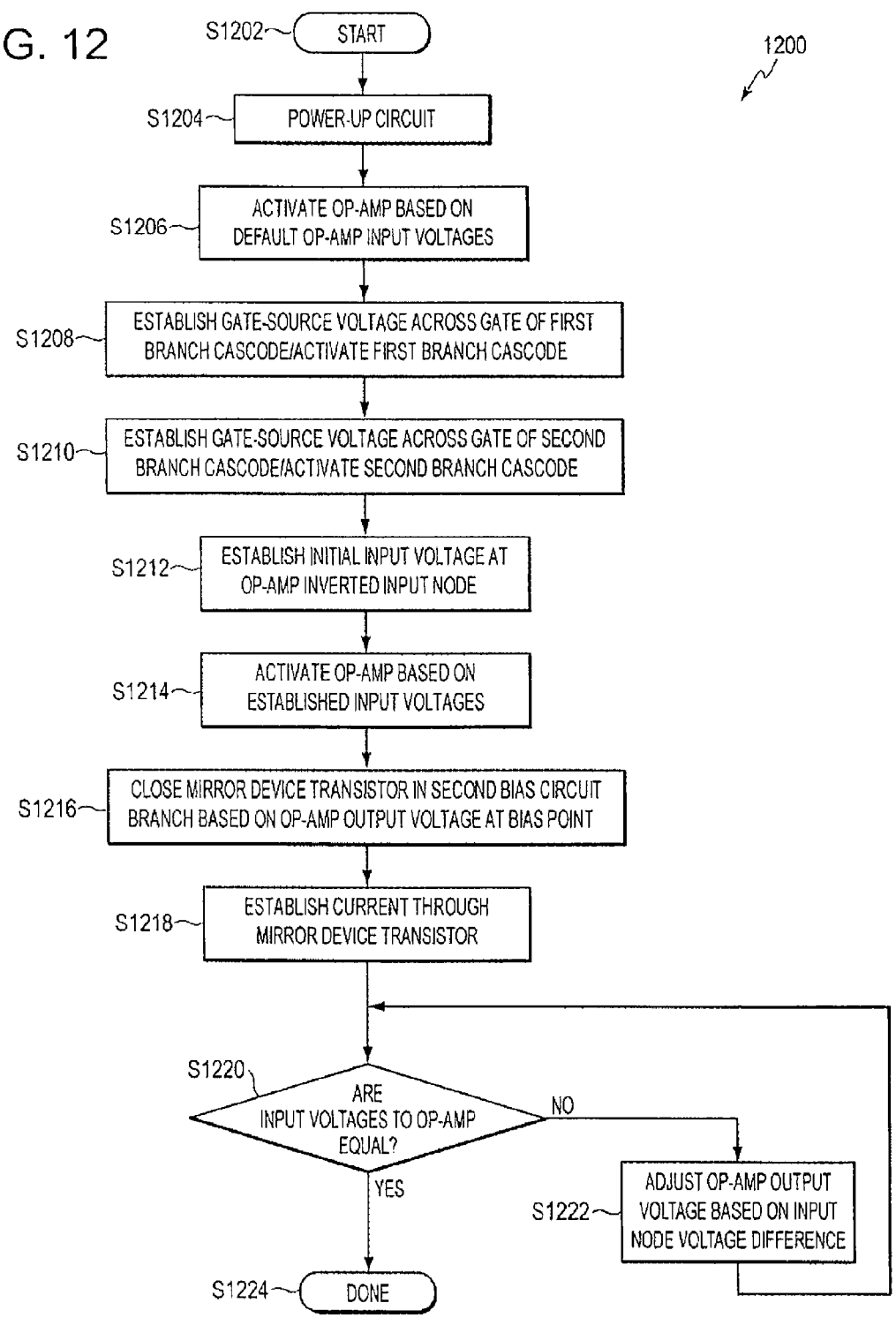
FIG. 12 a flow-chart of a process for starting up an example embodiment of the amplifier biasing circuit shown in FIG. 10.

FIG. 12 a flow-chart of a process for starting up an example embodiment of the amplifier biasing circuit shown in FIG. 10 and FIG. 11. As shown in FIG. 12, operation of the process begins at S1202 and proceeds to S1204.

At S1204, power is supplied to bias circuit 1000, and operation of the process continues at S1206.

At S1206, voltage differences at node 1018 and 1022, as a result of powering up the circuit activate operational amplifier 1012, generate an output voltage at node 1024, and operation of the process continues at S1208.

At S1208, initial output voltage from operational amplifier 1012 closes transistor 1034 and establishes a gate-source voltage across the gate of cascode transistor 1004, and operation of the process continues at S1210.

At S1210, the voltage established across the gate of cascode transistor 1004 at S1208, results in a voltage at node 1020 and establishes a gate-source voltage across the gate of cascode transistor 1002, thereby closing cascode transistor 1002, and operation of the process continues at S1212.

At S1212, a voltage is established at node 1022 on the inverted input node of operational amplifier 1012 as a result of a current passing through closed cascode transistor 1004, closed transistor 1034 and trim resistor 1006, and operation of the process continues at S1214.

At S1214, the voltage difference between the voltages applied at the input nodes of operational amplifier 1012 fully activates operational amplifier 1012, and operation of the process continues at S1216.

At S1216, mirror device transistor 1010 is closed by the voltage generated at the output node of operational amplifier 1012 at node 1024 and operation of the process continues at S1218.

At S1218, a current is allowed to pass through mirror device 1010 and cascode transistor 1002, and operation of the process continues at S1220.

At S1220, if operational amplifier 1012 determines that a difference between the voltage at node 1018 and the voltage at node 1022 is zero, operation of the process terminates at S1224; otherwise, operation of the process continues at S1222.

At S1222, operational amplifier 1012 adjusts the output of operational amplifier 1012 at node 1024 based on the difference between the voltages applied to the two respective input nodes of operational amplifier 1012 at node 1018 and at node 1022, and operation of the process continues at S1220.

In the process described above, two feed back loops are established that control operation of bias circuit 1000. A first feedback loop is established between node 1024 and node 1018 that includes operational amplifier 1012 and mirror device transistor 1010. A second feedback loop is established between node 1024 and node 1022 that includes operational amplifier 1012 and transistor 1034. In response to any change in the voltages at node 1018 and node 1022, operational amplifier 1012 continues to adjust the voltage at node 1024, until the voltage at node 1018 and node 1022 are again equalized via the respective feedback loops. Once the difference between the input voltage at node 1018 and the input voltage at node 1022 is zero, the bias circuit initialization process is complete.

In bias circuit 1000, the current density through mirror device transistor 1010 is given by equation 1, below.

$$I_1 = k/2 * W_1/L_1 * (Vg_1 - Vt_1)^2 \qquad \text{EQ. 1}$$

Where $I_1$ is the current density through the transistor;
k is the charge-carrier effective mobility of the transistor device;
$W_1$ is the width of the transistor's channel;
$L_1$ is the length of the transistor's channel;
$Vg_1$ is the gate-to-source voltage of the transistor; and
$Vt_1$ is the gate threshold voltage of the transistor.

The current density through transistor 1034 is given by equation 2, below.

$$I_2 = k/2 * W_2/L_2 * (Vg_2 - IR - Vt_2)^2 \qquad \text{EQ. 2}$$

Where $I_2$ is the current density through the transistor;
k is the charge-carrier effective mobility of the transistor device;
$W_2$ is the width of the transistor's channel;
$L_2$ is the length of the transistor's channel;
$Vg_2$ is the gate-to-source voltage of the transistor;
$Vt_2$ is the gate threshold voltage of the transistor; and
IR is the voltage drop across trim resistor 1006.

The Gm of transistor 1010 ($Gm_1$) is given by equation 3, below.

$$Gm_1 = (2/R) * (1 - 1/\sqrt{n}) \qquad \text{EQ. 3}$$

Where R is the resistance value of trim resistor 1006; and $$n = \frac{W_2}{L_2} / \frac{W_1}{L_1} \qquad \text{EQ. 4}$$

Where $W_2$ is the channel width of transistor 1034;
$L_2$ is the channel length of transistor 1034;
$W_1$ is the channel width of transistor 1010; and
$L_1$ is the channel length of transistor 1010.

The Gm of transistor 1034 ($Gm_2$) is given by equation 4, below.

$$Gm_2 = (1/R)*(1-1/(2*\text{sqrt}(n)-1)) \qquad \text{EQ. 5}$$

Where n is defined by equation 4.

The ratio of the Gm of transistor 1010 to the Gm of transistor 1034 is given by equation 6, below.

$$Gm_1/Gm_2 = 2 - 1/\text{sqrt}(n) \qquad \text{EQ. 6}$$

Where n is defined by equation 4.

Based on equation 6, $Gm_1/Gm_2$ is greater than 1 for n>1, so negative feedback stronger than positive feedback. Further, $Gm_1/Gm_2$ approaches 2 as n increases. For example, for n=4: mirror Gm=1/R and ratio=1.5. Therefore, in order to configure bias circuit 1000 with a constant Gm of 1/R, transistor 1034 should be configured with a transistor channel width-to-length ratio that is 4-times the transistor channel width-to-length ratio of mirror device transistor 1010.

Figure 13:
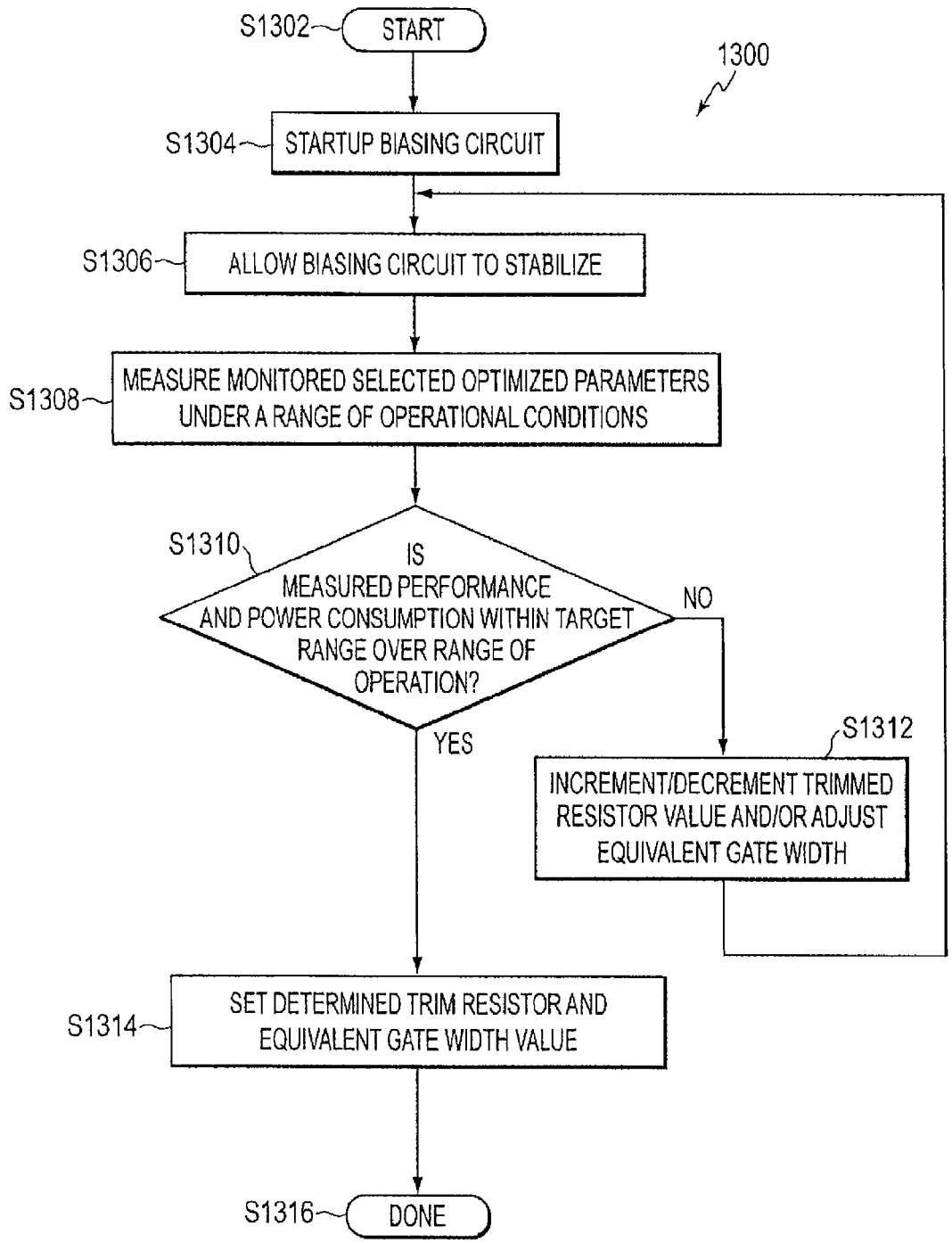
FIG. 13 is a flow-chart of a process for configuring an example embodiment of the amplifier biasing circuit shown in FIG. 10 with an equivalent Gm device channel width to channel length ratio (W/L) and a tuned resistor.

FIG. 13 is a flow-chart of a manual process that may be performed by a technician to determine an appropriate resistor value for trim resistor 1006, and an appropriate equivalent gate width for transistor 1034, within a specific implementation of bias circuit 1000, e.g., an implementation of bias circuit 1000 within a two-stage amplifier, such as multi-stage amplifier 400 described above with respect to FIG. 4 is which bias circuit 1000 provides a bias signal to second amplifier stage 408. Once the trim value and equivalent gate width are determined using the process described in FIG. 13, the same trim value and equivalent gate width settings may be used to configure similarly configured circuits. As shown in FIG. 13, operation of the process begins at S1302 and proceeds to S1304.

At S1304, bias circuit 1000 is started as described above with respect to FIG. 12, and operation of the process continues at S1306.

At S1306, bias circuit 1000 is allowed to stabilize, and operation of the process continues at S1308.

At S1308, a technician measures selected operational parameters within amplifier circuit 400 and/or within bias circuit 1000, e.g., voltage levels, current levels, gain, Gm, etc., over a range of operational conditions, e.g., a range of operating temperatures, and operation of the process continues at S1310.

At S1310, if a technician determines that performance and power consumption are acceptable, operation of the process continues at S1314; otherwise, operation of the process continues at S1312.

At S1312, the technician increments or decrements the resistor value, i.e., trims the resistor value, assigned to trim resistor 1006 and/or adjusts the effective gate width assigned to transistor 1034 using optional tuning circuit 1102, and operation of the process continues at S1306.

At S1314, the technician permanently assigns the determined resistor value to trim resistor 1006 and the determined gate width to transistor 1034, and operation of the process terminates at S1316.

For purposes of explanation, in the above description, numerous specific details are set forth in order to provide a thorough understanding of the described amplifier biasing circuit that reduces gain variation in short channel amplifiers, the described amplifier biasing circuit that produces a constant Gm biasing signal for short channel amplifiers, and the described multistage amplifier that uses example embodiments of both types of biasing circuits. It will be apparent, however, to one skilled in the art that the described bias circuits and amplifier circuits may be practiced without these specific details. In other instances, well-known structures and devices are shown in block diagram form in order to avoid obscuring the features of the described amplifier biasing circuit.

While the described amplifier biasing circuit that reduces gain variation in short channel amplifiers, the described amplifier biasing circuit that produces a constant Gm biasing signal for short channel amplifiers, and the described multistage amplifier that uses example embodiments of both types of biasing circuits have been described in conjunction with the specific embodiments thereof, it is evident that many alternatives, modifications, and variations will be apparent to those skilled in the art. Accordingly, embodiments of the described level bias circuits and amplifier circuits as set forth herein are intended to be illustrative, not limiting. There are changes that may be made without departing from the scope of the invention.

What is claimed is:

1. A system, comprising:
at least two or more amplifier stages coupled in series, each amplifier stage configured to receive bias signal output from a corresponding bias signal circuit among at least two or more bias signal circuits; and
the at least two or more bias signal circuits, each bias signal circuit comprising:
a cascode transistor configured to source a current;
an operational amplifier configured to counteract changes in a gain of the bias signal circuit at different operating temperatures for reducing variations in the gain, a first input of the operational amplifier connected to a drain terminal of a mirror device transistor, a second input of the operation amplifier connected to the cascode transistor; and
a variable resistor configured to control a resistance, the variable resistor being connected with the mirror device transistor.

2. The system of claim 1, wherein the each amplifier stage includes short channel transistor devices having approximately 60 nm lengths of gate channels.

3. The system of claim 1, wherein the bias signal biases an amplifier stage to apply a gain to an input signal received by the amplifier stage.

4. The system of claim 1, wherein an output of the system corresponds to an input signal received by a first amplifier stage of the at least two or more amplifier stages times a gain of the first amplifier stage times gains of successive amplifier stages of the at least two or more amplifier stages.

5. The system of claim 1, wherein the current is a constant current.

6. The system of claim 5, further comprising:
a constant current source configured to supply the constant current, the constant current source being connected in series with the cascode transistor.

7. The system of claim 6, wherein the second input of the operation amplifier is connected between the cascode transistor and the constant current source.

8. The system of claim 1, wherein the variable resistor is connected in series with the mirror device transistor.

9. The system of claim 1, wherein an output of the operational amplifier is connected to a gate terminal of the mirror device transistor.

10. The system of claim 1, wherein the cascode transistor is a first cascode transistor, further comprising:
a second cascode transistor having a second gate connected with a first gate of the first cascode transistor, the second cascode transistor connected in series with the mirror device transistor.

11. A method of reducing gain variations of a bias signal circuit, comprising:
- coupling at least two or more amplifier stages in series, each amplifier stage receiving bias signal output from a corresponding bias signal circuit among at least two or more bias signal circuits;
- sourcing a current by a cascode transistor in each bias signal circuit of the at least two or more bias signal circuits;
- counteracting changes in a gain of the bias signal circuit at different operating temperatures for reducing variations in the gain by an operational amplifier of the bias signal circuit, a first input of the operational amplifier connected to a drain terminal of a mirror device transistor, a second input of the operation amplifier connected to the cascode transistor; and
- controlling a resistance by a variable resistor connected with the mirror device transistor.

12. The method of claim 11, further comprising:
coupling the at least two or more amplifier stages, each amplifier stage including short channel transistor devices having approximately 60 nm lengths of gate channels.

13. The method of claim 11, further comprising:
biasing an amplifier stage by the bias signal to apply a gain to a received input signal.

14. The method of claim 11, further comprising:
generating an output by the at least two or more amplifier stages, the output corresponds to an input signal received by a first amplifier stage of the at least two or more amplifier stages times a gain of the first amplifier stage times gains of successive amplifier stages of the at least two or more amplifier stages.

15. The method of claim 11, further comprising:
sourcing the current that is a constant current.

16. The method of claim 15, further comprising:
supplying the constant current by a constant current source connected in series with the cascode transistor.

17. The method of claim 16, further comprising:
counteracting the changes by the operational amplifier having the second input connected between the cascode transistor and the constant current source.

18. The method of claim 11, further comprising:
controlling the resistance by the variable resistor connected in series with the mirror device transistor.

19. The method of claim 11, further comprising:
counteracting the changes by the operational amplifier having the output connected to a gate terminal of the mirror device transistor.

20. The method of claim 11, wherein the cascode transistor is a first cascode transistor, further comprising:
sourcing the current by the first cascode transistor having a first gate connected with a second cascode transistor, the second cascode transistor connected in series with the mirror device transistor.

* * * * *